(12) United States Patent
Guenther et al.

(10) Patent No.: US 7,562,320 B2
(45) Date of Patent: Jul. 14, 2009

(54) ASIC BASED CONVEYOR BELT STYLE PROGRAMMABLE CROSS-POINT SWITCH HARDWARE ACCELERATED SIMULATION ENGINE

(75) Inventors: Gernot E. Guenther, Endicott, NY (US); Viktor Sandor Gyuris, Wappingers Falls, NY (US); Thomas J. Tryt, Binghamton, NY (US); John H. Westerman, Jr., Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 11/532,248

(22) Filed: Sep. 15, 2006

(65) Prior Publication Data

US 2008/0127012 A1      May 29, 2008

(51) Int. Cl.
*G06F 17/50* (2006.01)
(52) U.S. Cl. .................. 716/4; 716/1; 716/5; 716/18; 703/13; 703/14; 703/23; 703/24; 703/25
(58) Field of Classification Search ............... 716/1, 716/5, 6, 17, 18, 4; 703/13–35
See application file for complete search history.

(56) References Cited

U.S. PATENT DOCUMENTS

| | | | |
|---|---|---|---|
| 5,425,036 A | 6/1995 | Liu et al. | |
| 5,452,227 A | 9/1995 | Kelsey et al. | |
| 5,467,462 A | 11/1995 | Fujii | |
| 5,612,891 A | 3/1997 | Butts et al. | |
| 2003/0040896 A1* | 2/2003 | McWilliams et al. | 703/13 |
| 2004/0249623 A1* | 12/2004 | Selvidge et al. | 703/23 |
| 2006/0005173 A1* | 1/2006 | Eng | 717/140 |
| 2007/0083353 A1* | 4/2007 | Selvidge et al. | 703/23 |
| 2007/0162270 A1* | 7/2007 | Guenther et al. | 703/22 |
| 2008/0127006 A1* | 5/2008 | Guenther et al. | 716/4 |

OTHER PUBLICATIONS

Dimitrios Stiliadis and Anujan Varma, "A Reconfigurable Hardware Approach to Network Simulation" ACM Transactions on Modeling and Computer Simulation, vol. 7, No. 1, (Jan. 1997) pp. 131-156.
S.S. Yau and H.S. Fung, "Associative Processor Architectu re—A Survey", Computing Surveys, vol. 9, No. 1, (Mar. 1977) pp. 3-27.
Dmitrios Stiliadis and Anujan Varma, A Reconfigurable Hardware Approach to Network Simulation, ACM Trans. On Modeling and Computer Simulation, vol. 7, No. 1, Jan. 1997, pp. 131-156.
S.S. Yau and H.S. Fung, "Associative Processor Architecture—A Survey" Computing Surveys, vol. 9, No. 1, Mar. 1977, pp. 3-27.

* cited by examiner

*Primary Examiner*—Paul Dinh
*Assistant Examiner*—Nghia M Doan
(74) *Attorney, Agent, or Firm*—John E. Campbell

(57) ABSTRACT

An ASIC based hardware accelerated simulation engine accelerates logic verification of integrated circuit designs utilizing a field of ASIC chips interconnected by direct connections. Communication between the chips has to be accomplished by switching technology internal to the chips. The switching technology employing programmable cross-point switches; i.e. hardware elements with input, output and command ports which propagate signals from the input ports to the output ports following a given permutation determined by values on the command port. The ASIC chip contains an instruction memory to program the logic elements thereof. A conveyor belt based implementation of the programmable cross-point switches provides reduced command bit requirements.

20 Claims, 5 Drawing Sheets

ASIC BASED CONVEYOR BELT STYLE PROGRAMMABLE CROSS-POINT SWITCH HARDWARE ACCELERATED SIMULATION ENGINE

DESCRIPTION OF BACKGROUND

In the process of circuit design the designer first defines the design by describing it in a formal hardware description language. Such definition takes the form of a data file.

One of the subsequent phases on the road to physical realization of the design is logic verification. In the logic verification phase the logic designer tests the design to determine if the logic design meets the specifications/requirements. One method of logic verification is simulation.

During the process of simulation a software program or a hardware engine (the simulator) is employed to imitate the running of the circuit design. During simulation the designer can get snapshots of the dynamic state of the design under test. The simulator will imitate the running of the design significantly slower than the final realization of the design. This is especially true for a software simulator where the speed could be a prohibitive factor.

In the past, to achieve close to real time simulation speeds special purpose hardware accelerated simulation engines have been developed. Such engines consist of a computer, an attached hardware unit, a compiler, and a runtime facilitator program.

Hardware accelerated simulation engine vendors have developed two main types of simulation engines comprising: Field Programmable Gate Array (FPGA) based simulation engines and ASIC based simulation engines.

A Field Programmable Gate Array (FPGA) based simulation engine employs a field of FPGA chips placed on multiple boards, connected by a network of IO lines. Each FPGA chip is preprogrammed to simulate a particular segment of the design. While these engines are achieving close to real-time speeds their capacity is limited by the size of the FPGA.

ASIC based simulation engines employ a field of ASIC chips placed on one or more boards. Such ASIC chips include two major components: the Logic Evaluation Unit (LEU) and the Instruction Memory (IM). The LEU acts as an FPGA based simulation engine that is programmed using instructions stored in the IM. The simulation of a single time step of the design is achieved in multiple simulator steps. In each of these simulation steps an instruction row is read from the IM and is used to reconfigure the LEU. The simulation step is concluded by allowing each such configured LEU to take a single step and to evaluate the design piece it represents.

ASIC based simulation engines need to perform multiple steps to simulate a single design time step. Hence they are inherently slower than FPGA based engines, although the gap is shrinking. In exchange, the capacity of ASIC based simulation engines is bigger.

The LEU has two major functions: to simulate the design piece for which it is programmed and to route various signals of the DEUT to other LEU units on the simulator engine. The latter task is achieved by employing, among other hardware elements, programmable cross-point switches.

A programmable cross-point switch is a hardware element that includes an array of input signals, an array of output signals, and an array of command signals. Assuming a fixed set of values on the command signals, the programmable cross-point switch behaves as if the output signals were directly connected to the input signals using some permutation. A different set of values on the command signals results in a different permutation A typical implementation of a programmable cross-point switch typically employs multiple multiplexers. Each output has a private multiplexer that connects it with one of the inputs based on the values of the command signals of the multiplexer.

The capacity of an ASIC based hardware accelerated simulation engine is determined by the number of ASIC chips it employs, by the size of the IM, by the size of an instruction row, and by the size of the design piece the LEU can simulate in a single simulator step. Many of these factors are bound by technology constraints.

Clearly, a need exists to increase capacity of an ASIC based hardware accelerated simulation engine.

SUMMARY OF THE INVENTION

The present invention effectively reduces the instruction row size. This is accomplished through an alternative implementation of a programmable cross-point switch that uses less command signals thereby reducing the size of the instruction row. The saving in instruction row size is achieved by utilizing the special requirements dictated by the hardware accelerated simulation engine environment. Details of these factors are as follows:

(1) Not every permutation map of the input signals to the output signals can be realized by a combination of the values of the command signals.

(2) The logic implementing the programmable cross-point switch runs at a significantly higher frequency than the cross-point switch itself. In one particular embodiment the logic of a LEU, and hence the logic of the cross-point switch, had a step rate of 1 nanosecond (ns), while the cross-point switch was expected to propagate a new set of input signals to the appropriate output signals only every 32 ns.

(3) The cross-point switch does not propagate all the input signals to the appropriate output signal with the same latency. The cross point switch achieves only a given average data throughput. In the above mentioned embodiment the cross-point switch propagation latency varied between 1 ns and 128 ns averaging 64 ns.

An ASIC based hardware accelerated simulation engine as described herein is a special purpose massively parallel computer designed to accelerate the process of logic verification of integrated circuit designs utilizing a field of ASIC chips. These ASIC chips are interconnected by direct connections; hence the communication between these chips must be accomplished by switching technology internal to the chips. The switching technology employs programmable cross-point switches, i.e. hardware elements each having an input port, an output port and a command port. The programmable cross-point switches propagate signals from their input ports to their output ports following a given permutation as determined by the values on the command port.

An ASIC chip contains an instruction memory to program the various logic elements thereof. By the regular operation of the ASIC chip, instruction rows are read out of the instruction memory in a sequential manner and a set of read instruction rows (after a decoding process) provides the command bits for the command ports of the various logic elements (the programmable cross-point switches among them) of the ASIC chip. As the size of the instruction memory directly influences the capacity and the usability of the ASIC based hardware accelerated simulation engine, it is desired to reduce the number of the required command bits.

The invention described herein provides a conveyor belt based implementation of the programmable cross-point switches that has a reduced command bit requirement compared to prior art solutions. The cross point switch described herein provides a solution which requires four times fewer command bits on the instructions word for driving the programmable cross-point switch.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
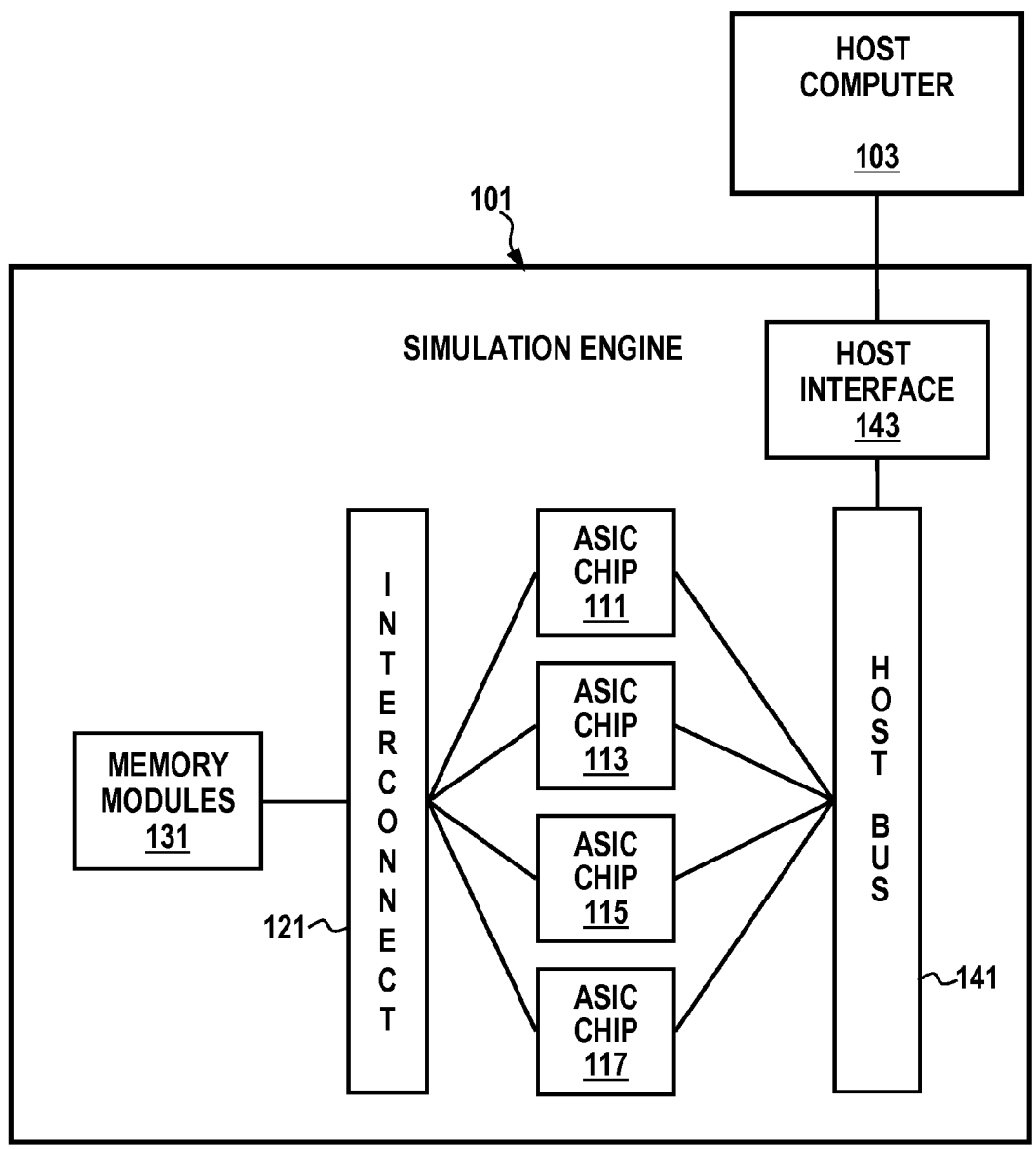
FIG. 1 is a block diagram illustrating the general concepts of an ASIC based hardware accelerated simulation engine.

The major components of an ASIC based hardware accelerated simulation engine are depicted in FIG. 1. The simulation engine consists of a field of ASIC chips, 111, 113, 115, 117, usually arranged on boards, boxes and systems. These ASIC chips are interconnected by direct connections 121 to each other facilitating direct high speed communication. Other elements of the hardware accelerated simulation engine 101 are memory modules 131 and other user supplied devices. These additional devices communicate with the field of ASIC chips using the aforementioned interconnect.

An additional low speed communication network comprising the host bus 141 and host interface 143, is provided to exchange data between the ASIC chips 111, 113, 115, 117, and the host computer 103. The host bus 141 is typically inactive or its functionality is severely limited while the ASIC chips, 111, 113, 115, 117 are active, i.e., performing simulation.

The interconnect network 121 consists of direct connections between the IO pins of the ASIC chips 111, 113, 115, 117 and that of the memory modules 131 and user supplied devices. Every direct connection of the interconnect network 121 has a pre-determined data flow direction designating one of its ends as input and the other as output. In accordance with this designation, the pins of the ASIC chips can be categorized as either input or output The interconnect network 121 consists of direct connections between the Input/Output (IO) pins of the ASIC chips 111, 113, 115, 117 and that of the memory modules 131 and user supplied devices. Every direct connection of the interconnect network 121 has a pre-determined data flow direction designating one of its ends as input and the other as output. In accordance with this designation, the pins of the ASIC chips can be categorized as either input pins or output pins.

To synchronize the data transfer on the interconnect, clock signals are used. In the typical embodiment 32 ns step rate was used on the interconnect 121. The operation of the ASIC chip can be based on a different clock. A typical embodiment uses a 1 ns step rate.

Figure 2:
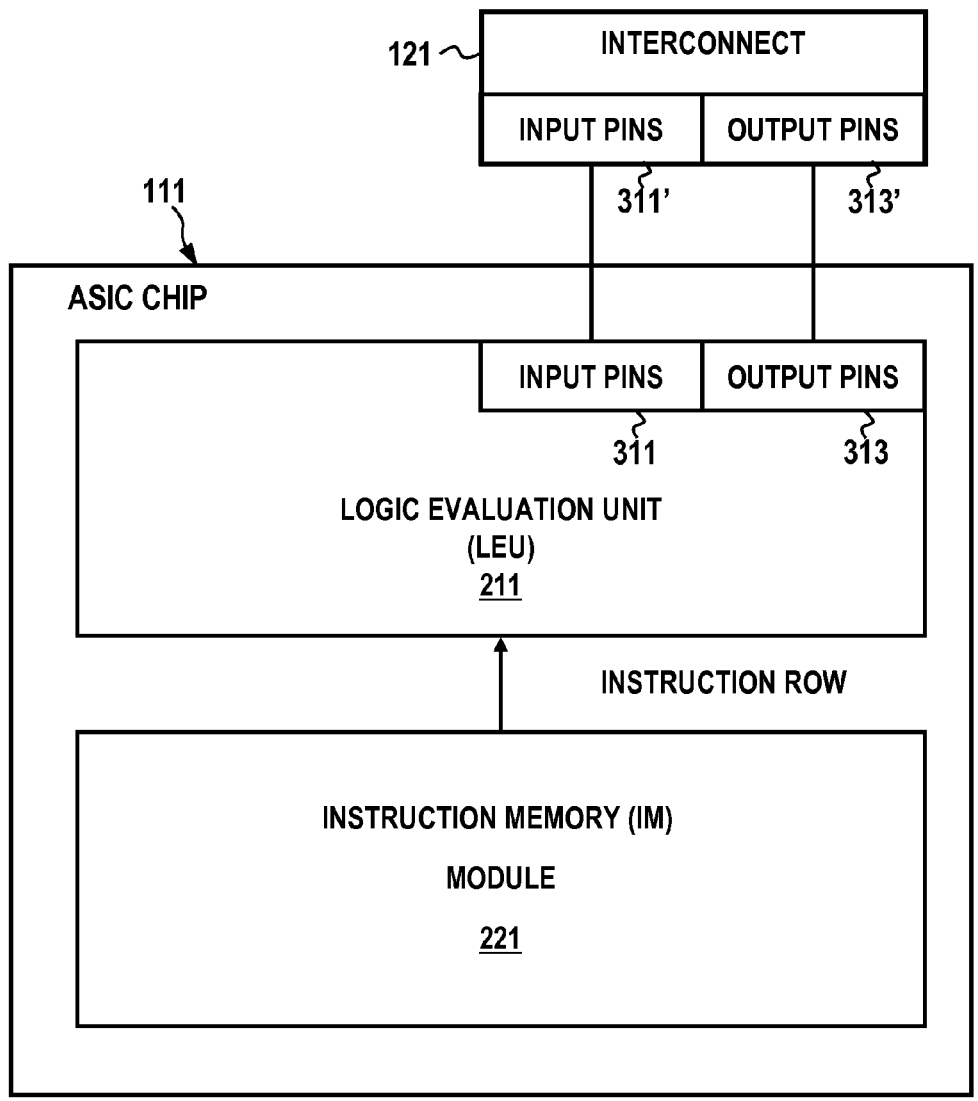
FIG. 2 is a block diagram illustrating the parts of an ASIC chip used in a hardware accelerated simulation engine including a Logic Evaluation Unit (LEU) and an Instruction Memory.

As depicted on FIG. 2, the ASIC chip 111 of FIG. 1 has two major components usually occupying close to half of the area of the chip comprising the Logic Evaluation Unit (LEU) 211 and the Instruction Memory (IM) Module 221. The operation of the ASIC chip 111 consists of two phases. In the first phase an instruction row is read from the Instruction Memory (IM) module 221 in a sequential manner, causing the instruction row to be decoded providing a decoded instruction, and then the bits of the decoded instruction are stored in the various command bits of the LEU 211.

In the second phase of operations of the ASIC chip 111, the LEU 211 will route signals from its input pins 311 to its internal storage registers, then it will simulate the running of a piece of the DEUT using its internal registers as stimuli, and will route signals from its internal storage registers to its output. The LEU 211 performs the listed three actions guided by the values stored on its command bit registers 541, 543 and 545 in FIG. 5.

In the preferred embodiment of the invention the aforementioned two phases are performed in parallel in a pipelined manner.

Figure 3:
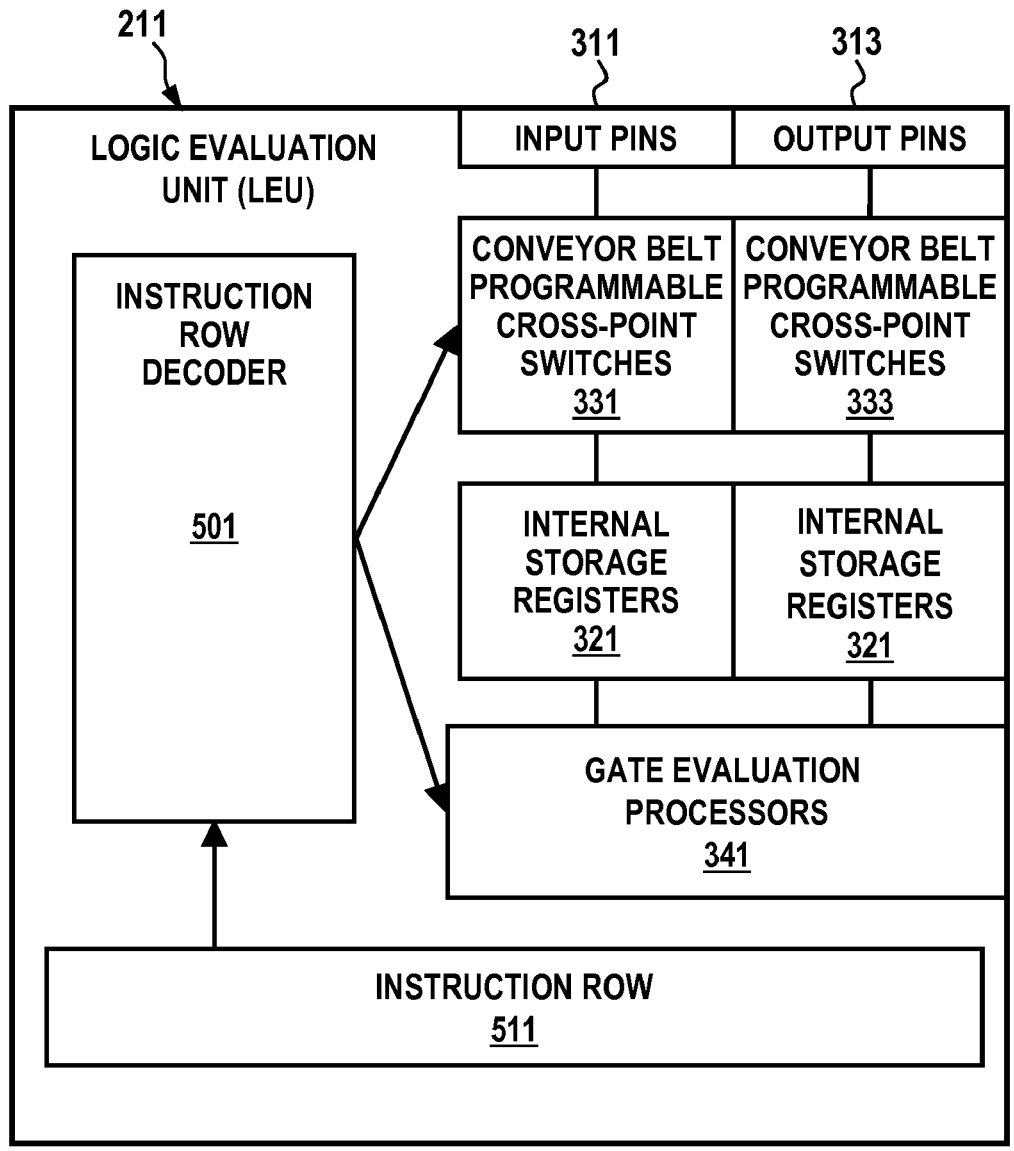
FIG. 3 is a block diagram illustrating the parts of a Logic Evaluation Unit.

As illustrated in FIG. 3, the LEU 211 of FIG. 2 is shown with two programmable cross point switches 331, 333 employed in phase 2 to route signals from the input pins 311 to the internal storage registers 321 and from the internal storage registers 321 to the output pins through the two programmable cross point switches 331, 333. These hardware devices propagate values from their input registers to their output registers using a permutation that is determined by the values stored on the command lines.

Figure 5:
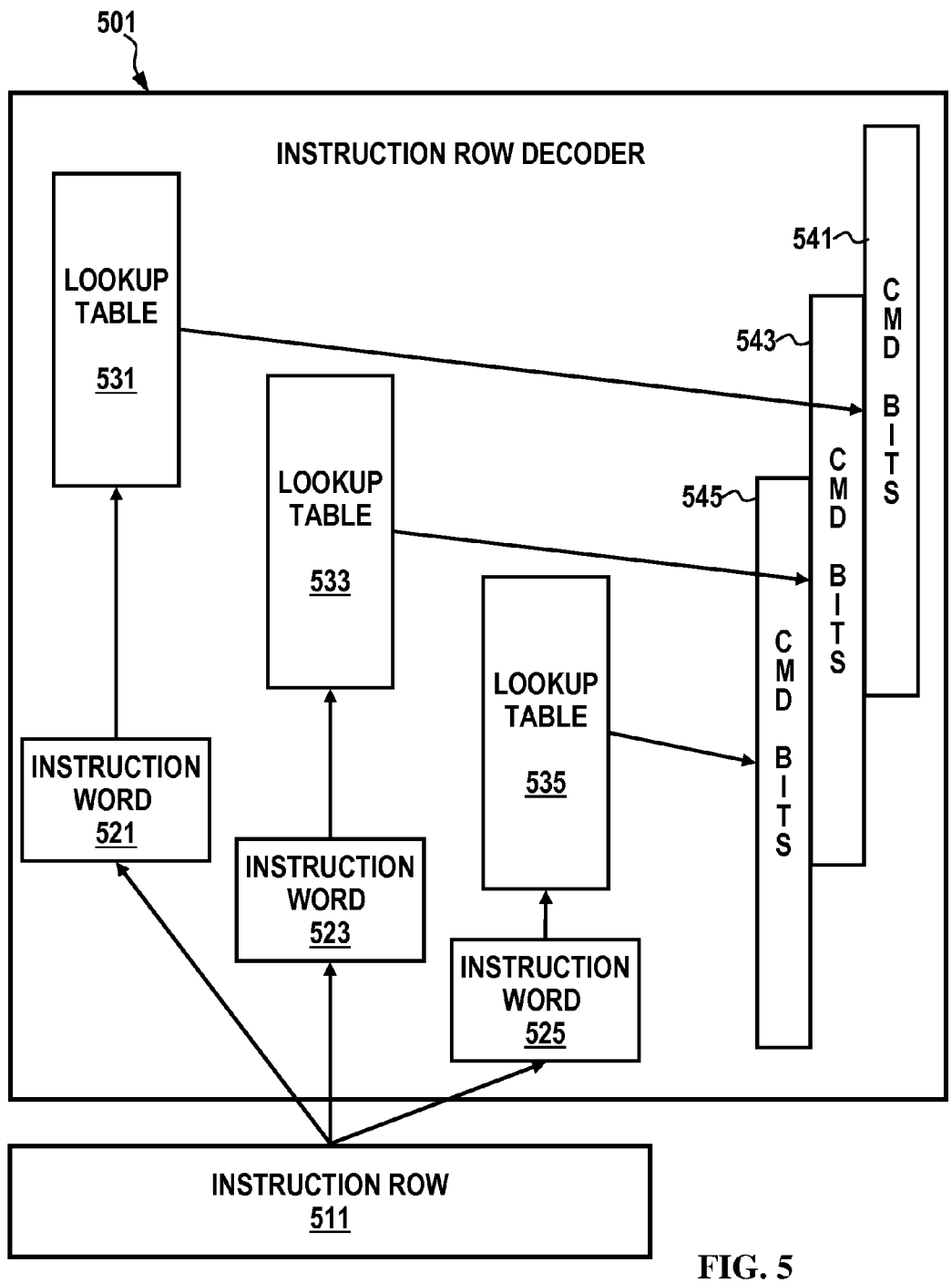
FIG. 5 is a block diagram illustrating an instruction row decoder.

The Gate Evaluation Processors 341 in FIG. 3 receive their command bits from the instruction row decoder 501 of FIG. 3, which is illustrated in detail in FIG. 5. An instruction row 511 has its output connected to the instruction row decoder 501. The instruction row decoder 501 has outputs connected to the gate evaluation processors 341 and the programmable cross-point switches 331 and 333. Based on these command bits, the Gate Evaluation Processors 341 can simulate a piece of the DEUT. During the simulation the internal registers 321 of the LEU 211 serve as a stimulus, and the output of the simulation is stored in the very same set of internal registers 321.

Figure 4:
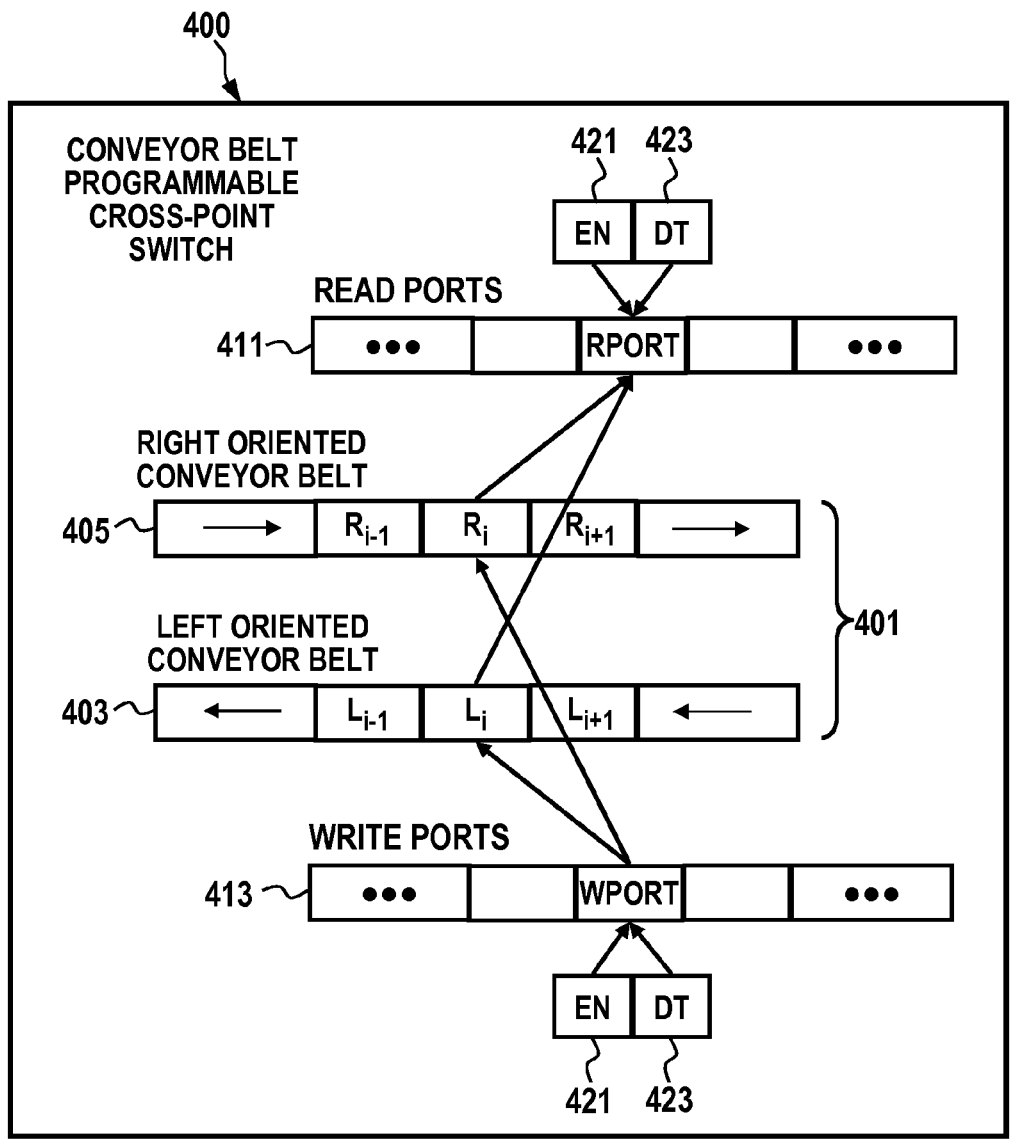
FIG. 4 is a block diagram illustrating the parts of a programmable cross-point switch.

FIG. 4 is a block diagram of the parts of a programmable cross-point switch 400, which illustrates the action of each of the two programmable cross point switches 331, 333. Each of the programmable cross point switches 331, 333 employs two conveyor belts 401, including conveyor belt 403 and conveyor belt 405. The two conveyor belts 401 comprise a left oriented conveyor belt 403 and a right oriented conveyor belt 405. A conveyor belt 401 is a circular ring of registers. Each register of the conveyor belts 403, 405 updates its value at the clock rate of the LEU 211 in FIG. 2. In a left oriented conveyor belt 403, a register updates its value from the register neighbor on its left. In a right oriented conveyor belt 405, a register updates its value from the register neighbor on its right.

The number of registers on each of the conveyor belts 403, 405 is equal and the number of registers is also equal to a corresponding number of input and output signals. A segment of the programmable cross point switches 400 of FIG. 4 consists of four registers: an input register, one register from the left and one from the right oriented conveyor belt 405 and one from the output registers. The left oriented conveyor belt 403 includes an input register $L_i$ in the center, a register $L_{i+1}$ on the right, and a register $L_{i-1}$ on the left thereof. The right oriented conveyor belt 405 includes an input register $R_i$ in the center, a register $R_{i+1}$ on the right, and a register $R_{i-1}$ on the left thereof.

To facilitate the placement and removal of signals to/from the conveyor belts 401, each of the segments is equipped with a read port 411 and write port 413. Each of these read ports 411 and write ports 413 has an enable command line 421 and a selection command line 423. Hence, each of the segments requires four command lines for the combination of the read ports 411 and write ports 413. The write ports 413 function in accordance with one of the two alternatives as follows:

(1) If the enable EN command line 421 is active then, based on the selection DT command line 423, one of the conveyor belt registers is updated from its neighbor while the other conveyor belt register is updated from the input register of the segment.

(2) If the enable EN line 421 is inactive then both conveyor belt registers of the segment are updated from their respective neighbor registers on the conveyor belt 401.

The read ports (RPORTs) 411 function in accordance with one of the two alternatives as follows:

(1) If the enable command line (EN) 421 is active then, based on the selection command (DT) line 423, the output register of the segment is updated from one of the conveyor belt registers.

(2) If the enable command line EN 421 is inactive then the output register retains its value from the previous LEU cycle.

The propagation of a signal from the input registers to one of the output registers requires the following phases. In some LEU step, referring to the write port (WPORTs) 413 of a segment, if the enable command line (EN) 421 is active then, based on the selection command (DT), line 423 of the segment has to be enabled and thus the signal has to be moved on one of the two conveyor belts 401. It is desirable that the one of the two conveyor belts 401, whose orientation results in a faster delivery, is selected. Once the signal is placed on one of the two conveyor belts 401, the segment that contains the target output register, has to remove it by having its read port RPORT 411 enabled and having its selection command port DT 423 select that appropriate one of the conveyor belts 401.

As the step rate of the LEU 211 is higher than that of the interconnect, the compiler has a time window to initiate the propagation. If the write port 413 of the segment that contains the signal is not receiving a write enable EN command from the write port 413 within the allotted time window, then the signal is over-written by the next signal arriving on the interconnect. Once the signal is placed on the selected one of conveyor belts 401 it will get passed to neighboring conveyor belt registers. After a given number of LEU instructions, the signal will arrive to one of the conveyor belt registers of the receiving segment. The read port 411 of the receiving segment has to be enabled at that LEU step.

In the typical embodiment, the conveyor belts 401 contained 256 registers realizing a 256×256 programmable cross point switches 400. It had 256 registers requiring 1024 command lines. As the LEU was running on a clock speed 32 times faster than that of the interconnect, the time window to forward a signal from the input register was 32 LEU steps. The implementation chooses the conveyor belt 401 that resulted in the lowest travel time: if the destination was 0-127 positions to the left then the left oriented conveyor belt 403 was selected while if the destination was 1-128 positions to the right then the right oriented conveyor belt 405 was selected. Utilizing the uniform distribution of the signal targets, we concluded that in average a signal had to travel 64 LEU steps, that is, for the duration of two interconnect steps.

Finally, FIG. 5 illustrates the instruction row decoder 501 which performs the process of providing the command bits to the programmable cross point switch 400 of FIG. 4 and to the Gate Evaluation Processors 341 of FIG. 3. The date in the instruction row 511 is subdivided into multiple instruction words 521, 523, 525 as shown by separate lines connecting from the instruction row 511 to each of the instruction words 521, 523, and 525. Each instruction word 521, 523, or 525 has an associated, respective lookup table 531, 533, or 535 that is used to translate an instruction word into a set of command bit registers 541, 543, or 545 by a separate line connecting table 531 to register 541, table 533 to register 543 and table 535 to register 545. Instruction word 521 has a separate output line connecting to lookup table 531. Instruction word 523 has a separate output line connecting to lookup table 533. Instruction word 525 has a separate output line connecting to lookup table 535. Lookup table 531 has a separate line connecting to the command bit register 541. Lookup table 533 has a separate line connecting to the command bit register 543. Lookup table 535 has a separate line connecting to the command bit register 545. During the lookup process the row of the lookup table 531, 533, or 535 addressed by the respective instruction word 521, 523, or 525 is selected and its value is copied into the corresponding command bit registers 541, 543, and 545.

The capabilities of the present invention can be implemented in hardware. Additionally, the invention or various implementations of it may be implementation in software. When implemented in software, at least one program storage device readable by a machine, tangibly embodying at least one program of instructions executable by the machine to perform the capabilities of the present invention can be provided to carry the program code.

The circuit diagrams depicted herein are just examples. There may be many variations to these diagrams or the steps (or operations) described therein without departing from the spirit of the invention. For instance, the number of conveyor belts within a programmable cross point switch 400 may be 4 or 8 instead of 2. Another variation to the concept described herein is to define a segment as the collection of 2 or more registers of a conveyor belt 403 or 405 instead of just 1. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An ASIC based hardware accelerated simulation engine for accelerating a process of logic verification of integrated circuit designs including:
   a simulation engine memory module interconnected to a field of ASIC chips;
   each of said ASIC chips includes an Instruction Memory Module (IMM) and a Logic Evaluation Unit (LEU);
   said IMM having an instruction row output connected to an input of said LEU;
   said LEU including as follows:
      an Instruction Row Decoder (IRD) connected to said instruction row output;

Gate Evaluation Processors (GEPs) which simulate a piece of device under test, with said GEPs having an input connected to an output of said IRD;

Internal Storage Registers (ISRs) connected to said GEPs;

a pair of Conveyor Belt Programmable Cross-Point Switches (CBPCPS)s in said LEU connected between said ISRs and input pins to said ASIC chip and output pins from said ASIC chip with said IRD configured to provide command bits to said GEPs;

said GEPs in said ASIC chips being interconnected by a said pair of CBPCPSs and input pins and output pins to an interconnect network which provide a direct connection with said simulation engine memory module;

each of said CBPCPSs having an input port, an output port, and a command port; and each of said CBPCPSs being configured to propagate signals from said input port to said output port following a permutation determined by values on said command port.

2. The ASIC based hardware accelerated simulation engine of claim 1, wherein:

each of said ASIC chips includes said IMM having said instruction rows;

said instruction row being configured to be read out of said IMM in a sequential manner; and said instruction rows providing command bits for said command ports of said CBPCPSs of said ASIC chips.

3. The ASIC based hardware accelerated simulation engine of claim 1, wherein:

each said LEU in each of said ASIC chips each CBPCPS comprises a plurality of registers arrayed in a CBPCPS; and said CBPCPS comprises a left oriented conveyor belt and a right oriented conveyor belt.

4. The ASIC based hardware accelerated simulation engine of claim 3, wherein said ASIC chips each CBPCPS comprises a circular ring of registers forming said conveyor belt array.

5. The ASIC based hardware accelerated simulation engine of claim 4, wherein in said ASIC chips each said CBPCPS includes said circular ring of registers arrayed as said CBPCPS whereby a register of said CBPCPS updates its value from an adjacent register.

6. The ASIC based hardware accelerated simulation engine of claim 5, wherein said ASIC chips each update said registers in said CBPCPS at a clock rate associated to said simulation engine.

7. The ASIC based hardware accelerated simulation engine of claim 4, wherein a number of registers on said CBPCPS is equal to a corresponding number of input signals and output signals.

8. The ASIC based hardware accelerated simulation engine of claim 1, wherein:

each of said ASIC chips includes a CBPCPS which has been segmented;

where a segment of said CBPCPS consists of a left oriented conveyor belt and a right oriented conveyor belt; and four registers including an input register, one register from said left oriented conveyor belt and one from said right oriented conveyor belt, and an output register.

9. A method of logic verification comprising:

providing an ASIC based hardware accelerated simulation engine for accelerating a process of logic verification of integrated circuit designs including the steps arranged as follows:

providing a simulation engine memory module interconnected to a field of ASIC chips;

providing each of said ASIC chips with an Instruction Memory Module (IMM) and a Logic Evaluation Unit (LEU);

providing said IMM including an instruction row output connected to an input of said LEU with said LEU including an Instruction Row Decoder (IRD) connected to said instruction row output;

providing said LEU with Gate Evaluation Processors (GEPs) which simulate a piece of device under test and said GEPs having an input connected to an output of said IRD:

providing said LEU with Internal Storage Registers (ISRs) connected to said GEPs with said ISRs storing output of simulation by said GEPs:

providing said LEU with a pair of Conveyor Belt Programmable Cross-Point Switches (CBPCPS)s connected between said ISRs and input pins to said ASIC chip and and output pins from said ASIC chip with said IRD configured to provide command bits to said GEPs with said CBPCPS being internal to each of said ASIC chips and each said CBPCPS having an input port, an output port, and a command port;

interconnecting each said LEU in each of said ASIC chips with a said CBPCPS and input pins and output pins to an interconnect network providing a direct connection with said simulation engine memory module; and operating said programmable cross-point switches to propagate signals from said input port to said output port following a permutation determined by values on said command port.

10. The method of logic verification of claim 9, wherein:

said ASIC chips each comprise a said IMM having instruction rows;

said instruction rows being configured to be read out of said IMM in a sequential manners; and said instruction rows providing, storing, and transporting command bits for said command ports of said CBPCPSs of said ASIC chips.

11. The method of logic verification of claim 9, wherein said ASIC chips each include a plurality of registers arrayed in a CBPCPS.

12. The method of logic verification of claim 11, wherein said CBPCPSs in said ASIC chips each includes a circular ring of registers forming said CBPCPS.

13. The method of logic verification of claim 12, wherein said CBPCPSs in said ASIC chips each includes said circular ring of registers arrayed as a conveyor belt whereby a register of the conveyor belt updates its value from an adjacent register.

14. The method of logic verification of claim 13, wherein said ASIC chips each update their registers in said conveyor belt at a clock rate associated to said simulation engine.

15. The method of logic verification of claim 12, wherein a number of registers on said conveyor belts is equal to a corresponding number of input and output signals.

16. The method of logic verification of claim 9, wherein each of said ASIC chips includes said IMM with segmented CBPCPSs where a segment of a said CBPCPS consists of a left oriented conveyor belt and a right oriented conveyor belt, and four registers including an input register, one register from said left oriented conveyor belt and one from said right oriented conveyor belt, and one from an output register.

17. A program product comprising:

a computer readable storage device having computer readable program code thereon, said computer readable program code is executed by a computer system for controlling and configuring an ASIC based hardware accelerated simulation engine to accelerate the process of logic verification of integrated circuit designs;

where said hardware accelerated simulation engine comprises a plurality of ASIC chips each of which includes an Instruction Memory Module (IMM) and a Logic Evaluation Unit (LEU);

said LEU including an Instruction Row Decoder (IRD) connected to said instruction row output;

said LEU including Gate Evaluation Processors (GEPs) which simulate a piece of device under test with said GEPs having an input connected to an output of said IRD, with Internal Storage Registers (ISRs) in said LEU connected to said GEPs, with a pair of Conveyor Belt Programmable Cross-Point Switches (CBPCPS)s in said LEU connected between said ISRs and input pins to said ASIC chip and output pins from said ASIC chip; with said IRD configured to provide command bits to said gate evaluation processors;

said GEPs in said LEU in each said LEU in each of chips being interconnected by direct connections, with communication between said chips provided by a said CBPCPS;

said CBPCPS comprising an input port, an output port and a command port, and a plurality of registers arrayed to form a conveyor belt;

each of said ASIC chips comprises said CBPCPS which is segmented, where a segment of each of said CBPCPS consists of a left oriented conveyor belt and a right oriented conveyor belt;

four registers including an input register, one register from said left oriented conveyor belt and one from said right oriented conveyor belt, and one from an output registers;

wherein the method comprises said CBPCPS propagating signals from input ports to output ports following a permutation determined by values on a command port.

18. The program product of claim 17, wherein each of said ASIC chips comprises a plurality of registers, said instruction rows being adapted to be read out of said IMM in a sequential manner, said instruction rows providing, storing, and transporting command bits for the command ports of the said CBPCPSs the of said ASIC chips.

19. The program product of claim 17, wherein said ASIC chips each include said circular ring of registers arrayed as a conveyor belt whereby a register of said conveyor belt updates its value from an adjacent register at a clock rate associated to said simulation engine.

20. The program product of claim 17, wherein the number of registers on said conveyor belts is equal to the number of input and output signals.

* * * * *